United States Patent [19]

Nishio et al.

[11] Patent Number: 5,400,742
[45] Date of Patent: Mar. 28, 1995

[54] METHOD OF MANUFACTURING COMPOUND SEMICONDUCTOR AND APPARATUS

[75] Inventors: Johji Nishio, Tokyo; Takashi Fujii, Otokuni, both of Japan

[73] Assignee: Kabushiki Kaisha Toshiba, Kanagawa, Japan

[21] Appl. No.: 942,023

[22] Filed: Sep. 8, 1992

[30] Foreign Application Priority Data

Sep. 9, 1991 [JP] Japan .................................. 3-227651

[51] Int. Cl.⁶ ............................................. C30B 11/14
[52] U.S. Cl. ..................................... 117/223; 117/81; 117/83
[58] Field of Search ...................... 422/248; 156/616.1, 156/666.3, 616.4, 616.41; 164/122.2, 227, 345; 117/223, 81, 83

[56] References Cited

U.S. PATENT DOCUMENTS

| | | | |
|---|---|---|---|
| 3,060,065 | 10/1962 | Orem | 156/616.3 |
| 4,264,406 | 4/1981 | Hacskaylo | 156/616.41 |
| 4,776,971 | 10/1988 | Mattera et al. | 156/607 |
| 5,131,975 | 7/1992 | Bourret-Courchesne | 156/607 |

FOREIGN PATENT DOCUMENTS 62-167284 7/1987 Japan .................................. 156/616.4

OTHER PUBLICATIONS

Liquid Encapsulated, Vertical Bridgman Growth of Large Diameter, Low Dislocation Density, Semi-Insulating GaAs by K. Hoshikawa et al.; Journal of Crystal Growth, vol. 94, No. 3 (1989) 643–50.

Primary Examiner—Robert Kunemund
Attorney, Agent, or Firm—Finnegan, Henderson, Farabow, Garrett & Dunner

[57] ABSTRACT

A method of manufacturing a semiconductor boule, the method comprises providing a chamber having a crucible, introducing a material for forming the boule and a liquid encapsulant having a softening point into the crucible, heating the crucible to melt the material, cooling the material to grow a boule, and separating the grown boule from the crucible at a temperature higher than the softening point of the encapsulant.

An apparatus for manufacturing a semiconductor boule which comprises a chamber; a crucible for containing a seed crystal, a starting material, and a liquid encapsulant; a crucible shaft for holding the crucible; and a seed crystal shaft for holding the seed crystal and the boule formed by the seed crystal and starting material, the seed crystal shaft being elevated and rotated independently of the crucible shaft.

6 Claims, 3 Drawing Sheets

METHOD OF MANUFACTURING COMPOUND SEMICONDUCTOR AND APPARATUS

BACKGROUND OF THE INVENTION

1. Field of the Invention

The present invention relates to a method of forming a single crystal of a semiconductor compound and to an apparatus for manufacturing the same.

More particularly, the invention relates to a method or an apparatus of forming a single crystal of a semiconductor compound which is formed by using a seed crystal and a liquid encapsulant and which can easily be removed from a crucible.

2. Description of the Related Art

As a conventional method of forming a single crystal of a semiconductor compound, a vertical Bridgman method or a vertical gradient freeze method, which use a seed crystal and a liquid encapsulant, are known. A liquid encapsulant is a material that is easily changed from solid to liquid and back again by heating and cooling. These methods include a step for cooling a single crystal (or ingot, or boule) of a semiconductor compound in a crucible containing a liquid encapsulant. This cooling continues down to room temperature, after growth of the single having a desired crystal orientation is completed.

After the cooling step, the boule is taken out by holding the crucible upside down, by tapping the bottom of the crucible, or by deforming the crucible slightly. However, a long time is needed for this process, because the liquid encapsulant, which exists on the upper portion of the boule, changes to a solid state and disturbs the boule being removed from the crucible. Another problem is that cracks in the boule are often observed near the portion of the seed crystal, if the boule is forcibly removed from the crucible.

Especially, when the crucible is made of pyrolytic BN (pyrolytic boron nitride), the crucible is expected to be reused many times, so the boule has to be carefully removed so as to avoid damage to the crucible.

Two methods are known to solve such problems. A first known method is to dissolve the solid encapsulant by pouring methyl alcohol into the crucible, followed by heating the crucible or carrying out an ultrasonic treatment. After the solid encapsulant is dissolved, the boule is removed from the crucible by holding the crucible upside down, and either tapping the bottom portion of the crucible or deforming the crucible slightly.

A second known method is to hold a crucible, including a residual encapsulant and boule, upside down and to heat the crucible to a temperature above the softening point of the liquid encapsulant and then to remove the boule the same way as the first method.

However, in the known first method, a long time, for example, two or three days is required to permit removal of the boule, so the time efficiency is not improved. Another disadvantage of the first known method is that excessive exfoliation of an inner surface of the crucible can result after the residual liquid encapsulant and boule are removed. Such exfoliation not only reduces the number of times the crucible can be reused, but may cause residual liquid encapsulant to be caught on a portion of the side wall of the crucible which was peeled off by the exfoliations.

The problem of exfoliation is illustrated in FIGS. 1(a) and 1(b).

FIG. 1(a) shows a schematic sectional view of a crucible 12, which includes a liquid encapsulant 19 and a gallium arsenide (GaAs) boule 21. FIG. 1(b) shows a partial enlarged magnificent view of FIG. 1(a).

As is apparent from FIGS. 1(a) and 1(b), the more the crucible is used, the more difficult is removal of the boule from the crucible, because the exfoliations are increased. Accordingly, it is probable that the crucible will be damaged during removal of the boule.

In the second known method, the time for taking the boule out of the crucible is shorter than that of the first method, but a toxic gas is generated by decomposing a part of the boule, because the heating requires a temperature of about 800° C. Accordingly, the removal operation must be performed in an isolation apparatus to provide for safety of the operator. Thus, the time efficiency for removing the boule from the crucible is not improved.

SUMMARY OF THE INVENTION

A first object of the invention is to provide a method and apparatus for manufacturing a semiconductor compound, which provides for removal of a boule from a crucible in a short time. A second object of the invention is to avoid exfoliation of the crucible. To attain the first and second objects of the invention, there is provided a method of manufacturing boule comprises the steps of providing a chamber having a crucible; introducing a material for forming the boule and a liquid encapsulant having a softening point temperature into the crucible; heating the crucible for melting the material; cooling the material for growing the boule; and separating the grown boule from the crucible at a temperature higher than the softening point of the encapsulant.

In another aspect, the invention comprises an apparatus for manufacturing a boule of a semiconductor compound. The apparatus comprises a chamber; a crucible located in the chamber for containing a seed crystal, a starting material, and an encapsulant; a crucible shaft connected to the crucible; and a seed crystal shaft for holding the seed crystal and the boule formed by the seed crystal and starting material, the seed crystal shaft, being the shafts being capable of independent rotation and translation.

In accordance with the invention, a semiconductor boule can be easily removed from a crucible after finishing the growth of the boule. Accordingly, the cost of producing the boule is reduced because the time efficiency can be improved. In addition, a reduction of the time for processing the crucible and for removing the boule is realized. Also, the amount of exfoliation of the side wall is largely decreased, so the crucible can be reused a greater number of times.

BRIEF DESCRIPTION OF THE DRAWINGS

The other objects and advantages of the invention will be apparent from the following description, taken in conjunction with the accompanying drawings, in which.

DETAILED DESCRIPTION OF THE PREFERRED EMBODIMENTS

To arrive at the present invention, the inventors studied the hygroscopicity of boric oxide used as a liquid encapsulant, that is, the degree to which boric oxide absorbs moisture. Specifically, the inventors measured the moisture concentration in boric oxide by a MEA (Moisture Evolution Analysis) method. In this method, boric oxide, which is going to be measured, is heated to its melting point in dry air at a temperature of 1000° C. The moisture contained in the boric oxide driven off by the melting process and is then measured by absorbing the moisture in a $P_2O_5$ layer coated on an electrode in an electrolytic cell. The moisture absorbed in the $P_2O_5$ layer is electrically decomposed and is measured by the amount of the current drawn during the electrolysis.

This chemical reaction equation is given by

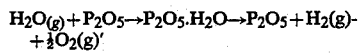

$$H_2O_{(g)} + P_2O_5 \rightarrow P_2O_5 \cdot H_2O \rightarrow P_2O_5 + H_2(g) + \tfrac{1}{2}O_2(g)'$$

From experimental results, the inventors verified that the boric oxide liquid encapsulant in the crucible, after finishing the growth of compound semiconductor boule and cooling the crucible to the room temperature, does not itself contain moisture. However, when the boric oxide without moisture is taken out to the air, the boric oxide very rapidly absorbs moistures in the air at its surface. Such absorption causes a large cubical expansion of the boric oxide liquid encapsulant.

As an extreme example of such cubical expansion, the crucible may be broken, merely by leaving the crucible in the air after growth of the boule. Even if methyl alcohol is poured into the crucible immediately after growth of the boule, the boric oxide still is able to absorb some moisture, and undergoes some cubical expansion. In this situation, when crucible 16 having exfoliation on the inner wall is used, as shown in FIG. 1(a), boule 21 cannot be easily removed because the expanded boric oxide 19 is caught by the portion exfoliated.

Figure 1:
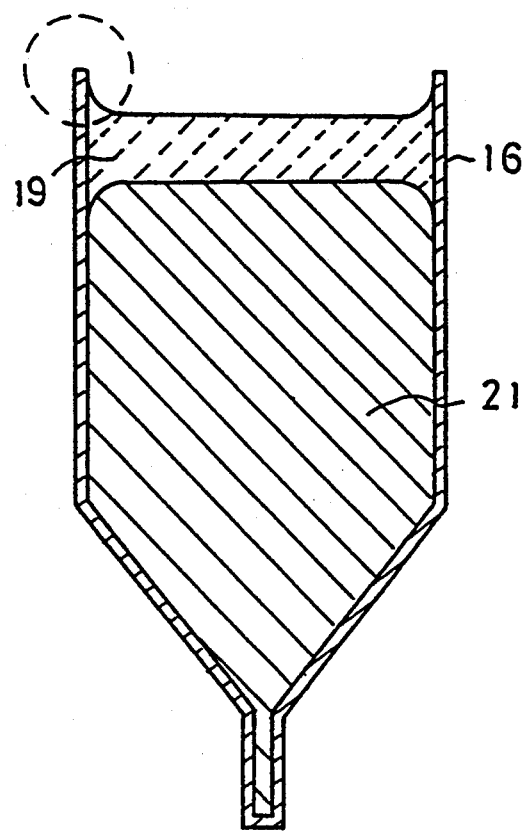
FIGS. 1(a) and 1(b) show schematic sectional partial views of an apparatus for manufacturing a boule according to a related art.
Figure 1:
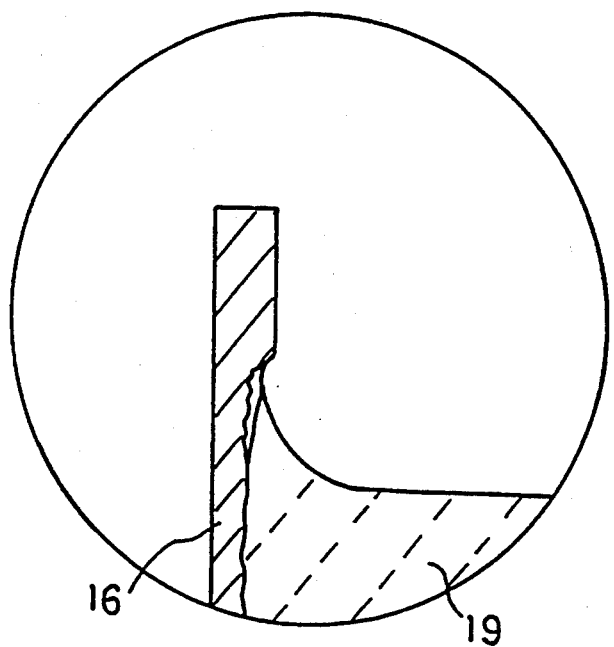

The difficulty of removal is promoted by the configuration of the meniscus, that is, the curved upper surface, of boric oxide 19, as shown in FIG. 1(a). If pyrolytic boron nitride is used as the crucible material, it is wetted by the boric oxide of the encapsulant, and the boric oxide changes to a solid state, so the configuration of meniscus, shown as FIG. 1(b), is easily caught by the exfoliation.

Considering these facts, the inventors have discovered that a main source of the difficulty in removing the boule from the crucible is the cubical expansion of boric oxide. Thus, the inventors conceived that a boule should be moved in an upper direction relatively to a crucible while the boric oxide liquid encapsulant is in a state of low viscosity and such that a grown boule is removed from the crucible and the liquid encapsulant permitted to remain in the crucible.

In this manner, even if the boule is cooled after growth, the generation of cracks or damage on the boule will be largely decreased, because the boule and the crucible or the liquid encapsulant are already separated.

The conventional first and second methods described above may be executed as a next step to remove the liquid encapsulant, and the problems of the conventional methods used alone will not occur. Because the crucible does not receive any physical stress when the boule is removed, exfoliations are considerably decreased and safety is increased.

Figure 2:
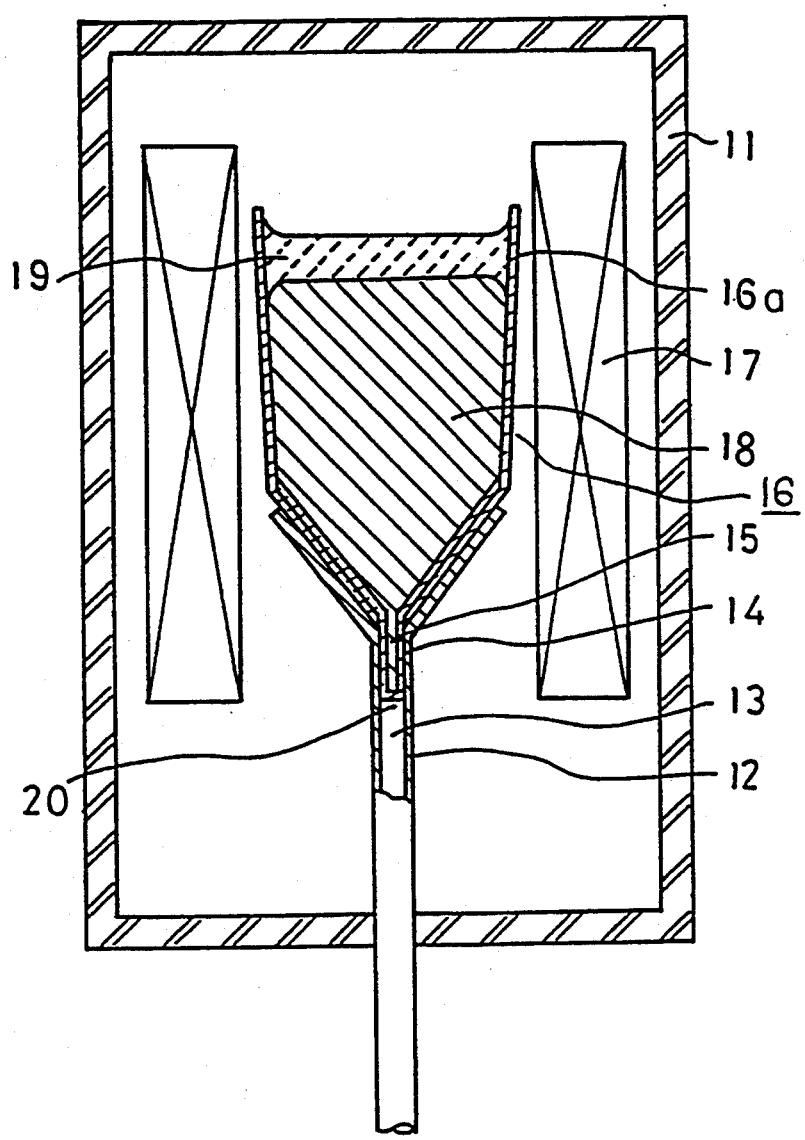
FIG. 2 shows a schematic sectional view of an apparatus for manufacturing a boule according to a first embodiment of the invention.

FIG. 2 shows a schematic view of an apparatus for manufacturing a GaAs boule applicable to a vertical Bridgman method, according to a first embodiment of the invention.

As shown in FIG. 2, a chamber 11 for manufacturing a GaAs boule contains a crucible shaft 12 which can rotate and elevate a crucible 16. Crucible 16 is made of pyrolytic boron nitride (BN), is formed as a unit with crucible shaft 12, and includes side walls 16a. A seed crystal shaft 13, which can rotate and elevate a holder 14, is concentrically located within crucible shaft 12. Seed crystal shaft 13 and crucible shaft 12 can thus be both independently rotated and independently elevated.

A seed crystal 15 is inserted at the bottom portion of holder 14 and other melt materials 18 are introduced in holder 14 and crucible 13. That is, the upper portion of holder 14 is a part of the bottom portion of crucible 16 when the boule is formed, but holder 14 is separable from crucible 16 which is connected to crucible shaft 12.

Crucible shaft 12 and seed crystal shaft 13 are independently controlled in movement. Crucible 16 is surrounded by a heater 17 and seed crystal shaft 13 has a thermocouple 20 to control the temperature of crucible 16 and the crucible contents.

A method of forming a GaAs boule, by using the apparatus of FIG. 2 will now be described. First, the seed crystal 15 is attached in the bottom portion of holder 14, which is on the tip portion of seed crystal shaft 13. A charge consisting of 300 g of polycrystalline gallium arsenide, 1500 g of gallium, and 1700 g of arsenic as a starting charge are introduced into crucible 16. A liquid encapsulant consisting of 600 g of boric oxide is introduced to prevent evaporation of the starting charge. Then, chamber 11 is evacuated to remove air in the chamber and argon (Ar) gas is introduced to a pressure of 35 atm. After this, heater 17 is energized to heat crucible 16 to form GaAs melt 18. At the time a layer of boric oxide liquid encapsulant 19 is formed on GaAs melt 18. Crucible shaft 12 and seed crucible shaft 13 are then rotated in common in the same direction at a rate of 5 rpm, to avoid relative rotation between shafts 12 and 13. Moreover, output of thermocouple 20 is monitored to permit maintenance of the desired temperature.

After keeping this state for 30 minutes, crucible shaft 12 and seed crystal shaft 13 are simultaneously moved downward at a lift speed of 4 mm/hour. At the time when finishing the movement to a desired position, the downward lift speed of crucible shaft 12 is accelerated to 20 mm/hour and that of seed crystal shaft 13 is set to be 0 mm/hr. Also, the rotation of crucible shaft 12 is stopped and that of seed crystal shaft 13 is kept at 5 rpm. At the time when crucible shaft 12 is vertically positioned at the desired location where a formed boule can be easily taken out, a step of cooling a boule 21 to a desired temperature is started by decreasing power to heater 17.

Figure 3:
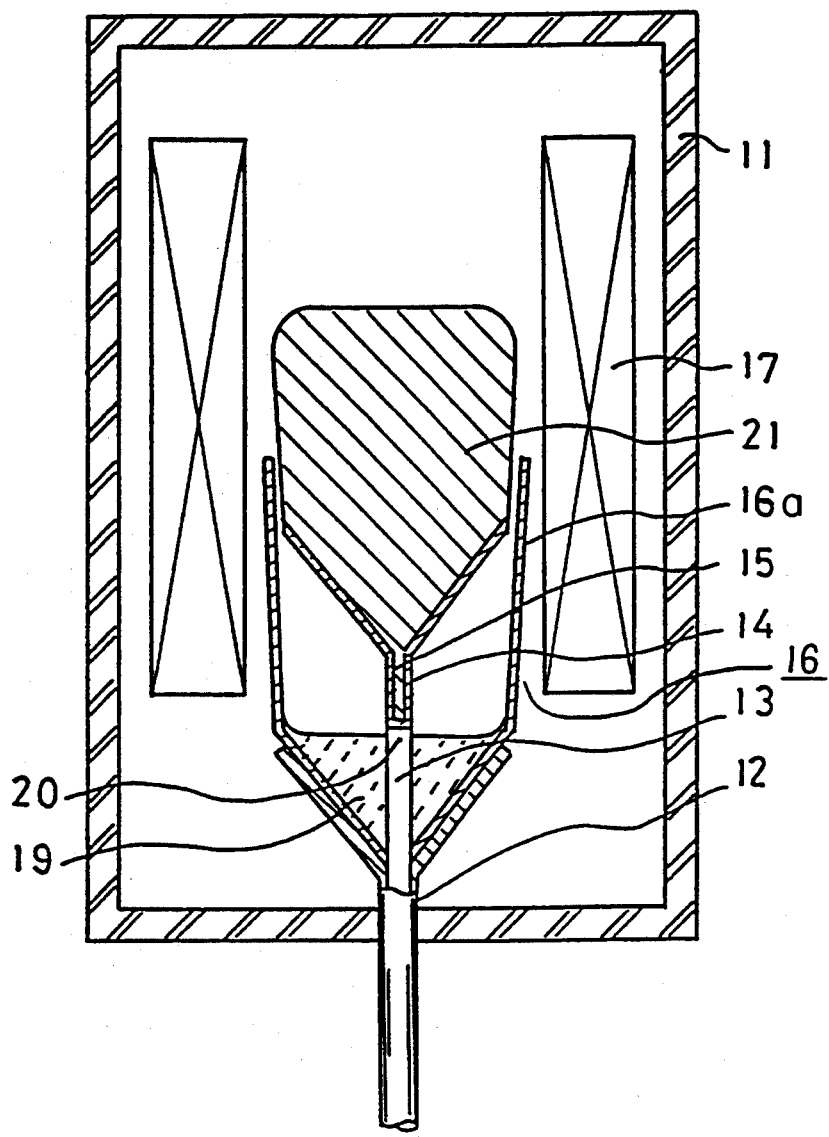
FIG. 3 shows a schematic sectional view of other apparatus for manufacturing a boule according to a second embodiment of the invention.

FIG. 3 shows this state in the cooling step. As shown in FIG. 3, boule 21 can be separated from the liquid encapsulant 19. Encapsulant 19, in liquid form, moves to the bottom of crucible 16 while boule 21 moves relative to side walls 16a. The rotation of seed crystal shaft 12 is stopped at this time. The relative positions of FIG. 3 are maintained when chamber 11 is opened to the air after chamber 11 is cooled.

Accordingly, grown GaAs boule 21 can be taken out from crucible 16 by holding the top portion of the crystal over the edge of crucible 16. The residual boric oxide encapsulant 19 in crucible 16 is completely dissolved within about one day by an immersion of methyl alcohol introduced into crucible 16 followed by an ultrasonic treatment. After this, the residual boric oxide encapsulant can be completely removed from crucible 16 by water treatment (washing).

By simultaneously processing a plurality of crucibles as described above, time efficiency needed to manufacture a boule can be significantly increased.

According to the method and apparatus of the embodiments according to the invention, the removal process from the crucible, which takes 2 or 3 days conventionally, can be carried out within a much shorter time and a large reduction of time can be realized. Also, the number of times for reusing the crucible is also improved. That is, crucibles according to the conventional method can be reused, on average, 10 times. However, when using the desired embodiment no exfoliation was observed after reusing the crucible 30 times, because minimal physical stress is needed to remove the boule from the crucible.

A method of manufacturing GaAs boule by a gradient freeze method as a second embodiment according to the invention is described with reference FIG. 2 and FIG. 3. An apparatus used in the embodiment is slightly different with respect to the configuration or the location of heater 17, but the remainder of the parts are common between the two embodiments. Therefore, a detailed description of the apparatus operation of the second embodiment will not be provided.

The processes of the second embodiment, up to the step of monitoring the output of a thermocouple 20 and keeping it at a desired temperature are the same as the first embodiment, but the next step for growing a GaAs boule is different. That is, after holding 30 minutes in the state shown in FIG. 2, during which thermocouple 20 is kept at the desired temperature, growth of the boule is by gradually decreasing the flow of power to heater 17 gradually. After finishing the growth of boule and cooling it to the desired temperature, crucible shaft 12 is started to move downward at 20 mm/hour of lift speed.

At the same time, rotation of crucible shaft 12 is stopped and the rotation of seed crystal shaft 13 is kept at 5 rpm. The boule thus moves relative to side walls 16a. When crucible shaft 12 is at the desired position, movement of crucible shaft 12 is ceased and the boule is started to cool down at a desired cooling rate by decreasing power supplied to heater 17. Rotation of crucible shaft 17 is then ended. The position of the apparatus at this time is shown in FIG. 3. This state is maintained up to the time when a chamber 11 is opened to the air after cooling the chamber to the room temperature.

Accordingly, the GaAs boule 21 can be easily taken out by holding a top portion of the crystal over the edge of crucible 16. As a result, no crack or damage to GaAs boule is observed. Also, residual boric oxide encapsulant 19 in crucible 19 can be removed in about one day by adding methyl alcohol in the crucible and giving ultrasonic treatment. By adding water washing, boric oxide 19 in the crucible can be completely removed.

According to the second embodiment, a result similar to the first embodiment can be obtained. That is, the time for taking boule 21 out of crucible 19 can be reduced to a period on the order of 10–20 minutes. Such time reduction contributes to a significant reduction in manufacturing cost of a boule of semiconductor compound. Because the number of reuses of the crucible is extremely increased, due to the large reduction of exfoliation from crucible and reduction in damage of the crucible during the step of removing the residual boric oxide encapsulant, a unit price of crucibles for manufacturing compound semiconductor boule are significantly decreased, thereby further reducing the manufacturing cost. Further manufacturing cost reduction is provided since processing of the residual liquid encapsulant can be carried out in parallel with manufacturing other boules.

As described above, the method and the apparatus can be applied for the vertical gradient freeze method as well as vertical Bridgman method and obtain similar results.

Numerous modifications and variations of the present invention are possible in light of the above teachings. For example, other compound semiconductor compounds, such as InP and GaP, can be used instead of GaAs. It is therefore to be understood that, within the scope of the appended claims, the present invention can be practiced in a manner other than as specifically described herein.

What is claimed is:

1. An apparatus for manufacturing a boule, comprising:
   a chamber;
   a crucible located in the chamber for containing a seed crystal, a starting material, and an encapsulant; a crucible shaft connected to the crucible; and
   a seed crystal shaft, the shafts being capable of independent rotation and translation.

2. An apparatus for manufacturing a semiconductor boule, comprising:
   a chamber;
   a crucible for containing a seed crystal, a starting material, and a liquid encapsulant;
   a crucible shaft for holding the crucible;
   a seed crystal shaft for holding the seed crystal and a boule formed by the seed crystal and starting material, the seed crystal shaft being capable of independent elevation relative to the crucible shaft.

3. An apparatus according to claim 1, wherein the crucible is made of boron nitride.

4. An apparatus according to claim 1, further comprising means for heating the crucible.

5. An apparatus according to claim 4, wherein the heating means comprises means for maintaining the temperature of encapsulant in the crucible at a temperature more than a softening point of the encapsulant while the seed crystal shaft is elevating relative to the crucible shaft.

6. An apparatus according to claim 5, wherein the heating means comprises a thermocouple provided in the seed crystal shaft.

* * * * *